(12) United States Patent
Suga et al.

(10) Patent No.: US 10,043,975 B2
(45) Date of Patent: Aug. 7, 2018

(54) THIN SUBSTRATE, METHOD FOR MANUFACTURING SAME, AND METHOD FOR TRANSPORTING SUBSTRATE

(71) Applicants: LAN TECHNICAL SERVICE CO., LTD., Shinjuku-ku (JP); Tadatomo Suga, Nakano-ku (JP)

(72) Inventors: Tadatomo Suga, Nakano-ku (JP); Yoshiie Matsumoto, Shinjuku-ku (JP)

(73) Assignee: LAN TECHNICAL SERVICE CO., LTD., Shinjuku-ku (JP)

( * ) Notice: Subject to any disclaimer, the term of this patent is extended or adjusted under 35 U.S.C. 154(b) by 0 days.

(21) Appl. No.: 15/325,924

(22) PCT Filed: Jul. 16, 2015

(86) PCT No.: PCT/JP2015/070368
§ 371 (c)(1),
(2) Date: Jan. 12, 2017

(87) PCT Pub. No.: WO2016/010106
PCT Pub. Date: Jan. 21, 2016

(65) Prior Publication Data
US 2017/0200891 A1 Jul. 13, 2017

(30) Foreign Application Priority Data
Jul. 16, 2014 (JP) ................. 2014-146356

(51) Int. Cl.
*H01L 51/00* (2006.01)
*H01L 51/52* (2006.01)
*H01L 51/56* (2006.01)

(52) U.S. Cl.
CPC .......... *H01L 51/003* (2013.01); *H01L 51/524* (2013.01); *H01L 51/56* (2013.01); *H01L 2227/326* (2013.01)

(58) Field of Classification Search
CPC ..... H01L 51/003; H01L 51/524; H01L 51/56; H01L 2227/326
(Continued)

(56) References Cited

U.S. PATENT DOCUMENTS

2005/0054178 A1* 3/2005 Utsunomiya ....... H01L 27/1214
438/458
2007/0128825 A1 6/2007 Suga et al.
(Continued)

FOREIGN PATENT DOCUMENTS

JP 2013-89922 A 5/2013
JP 2013-135181 A 7/2013
(Continued)

OTHER PUBLICATIONS

International Search Report dated Oct. 13, 2015 in PCT/JP2015/070368 filed Jul. 16, 2015.
(Continued)

*Primary Examiner* — Caleen Sullivan
(74) *Attorney, Agent, or Firm* — Oblon, McClelland, Maier & Neustadt, L.L.P.

(57) ABSTRACT

[Problem] To provide a technology that allows a film or glass to be bonded to a transport substrate and to be easily separated during the manufacture of a substrate.
[Solution] Provided is a method for manufacturing a substrate having an electronic device formed on a surface, the method comprising a formation step for forming an inorganic material layer on at least one of a bonding surface by which the substrate having an electronic device formed on a surface is to be bonded to a transport substrate, and a bonding surface on the transport substrate for transporting the substrate; a bonding step for pressing the substrate and the transport substrate against each other and bonding the
(Continued)

substrate and the transport substrate by the inorganic material layer; and a separation step for separating the substrate and the transport substrate.

36 Claims, 5 Drawing Sheets

(58) Field of Classification Search
 USPC .......................................................... 438/23
 See application file for complete search history.

(56) References Cited

U.S. PATENT DOCUMENTS

| 2009/0179160 | A1* | 7/2009 | Tsukamoto ....... H01L 21/76254 250/492.2 |
| 2014/0037945 | A1 | 2/2014 | Suga et al. |
| 2015/0086794 | A1 | 3/2015 | Akita et al. |
| 2015/0104656 | A1 | 4/2015 | Suga et al. |
| 2015/0294900 | A1 | 10/2015 | Goto et al. |

FOREIGN PATENT DOCUMENTS

| JP | 2014-113687 A | 6/2014 |
| WO | 2012/105474 A1 | 8/2012 |
| WO | 2013/154107 A1 | 10/2013 |
| WO | 2013/179881 A1 | 12/2013 |
| WO | 2014/084217 A1 | 6/2014 |

OTHER PUBLICATIONS

Extended European Search Report dated Feb. 13, 2018 in Patent Application No. 15821437.9, 9 pages.

* cited by examiner

[FIG. 1]
(a)
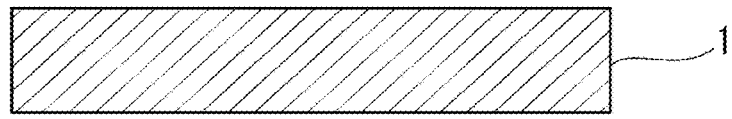
(b)
(c)
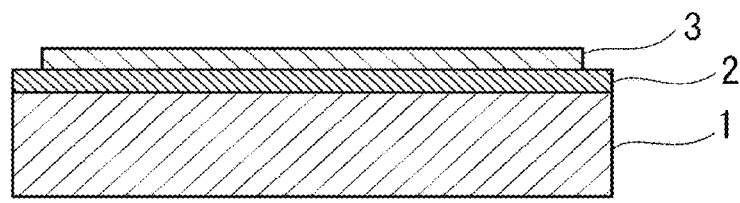
(d)
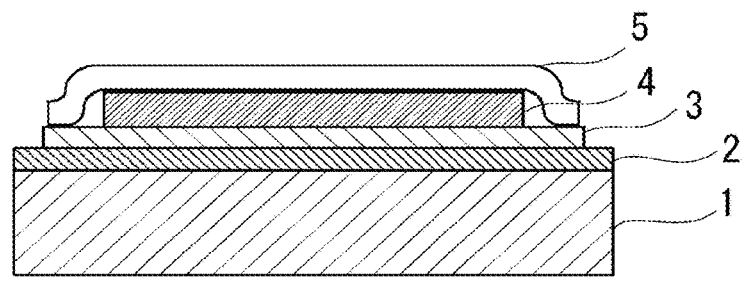
(e)
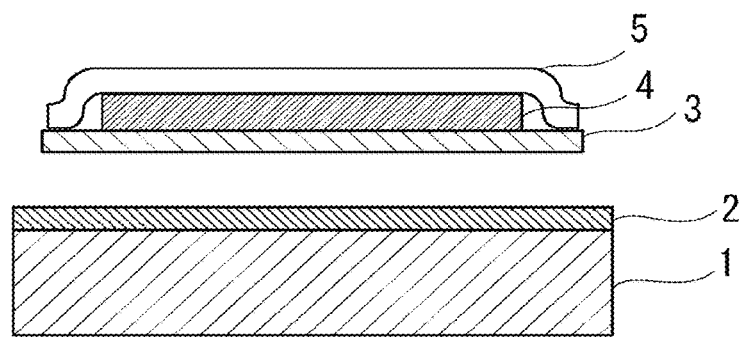

[FIG. 2]
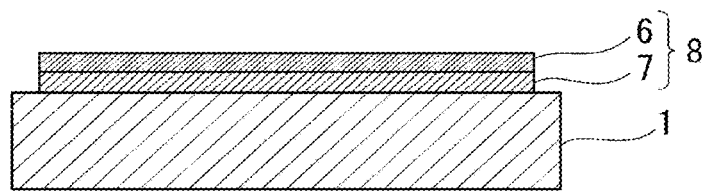
[FIG. 3]
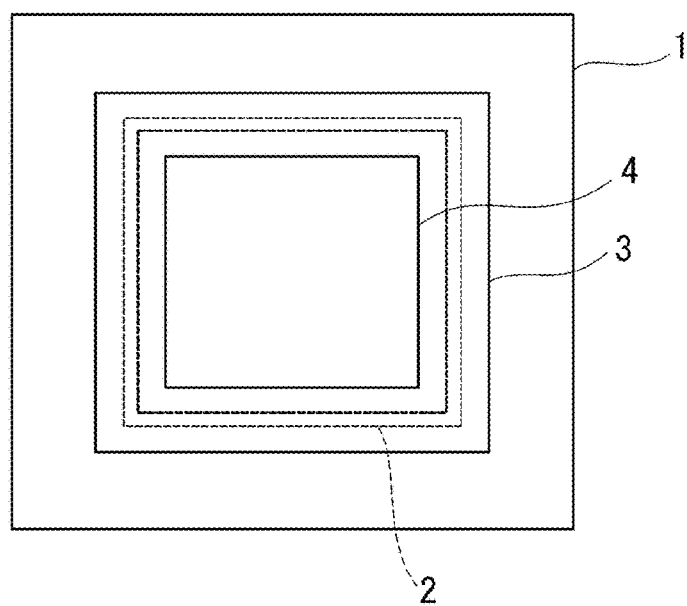

[FIG. 4]
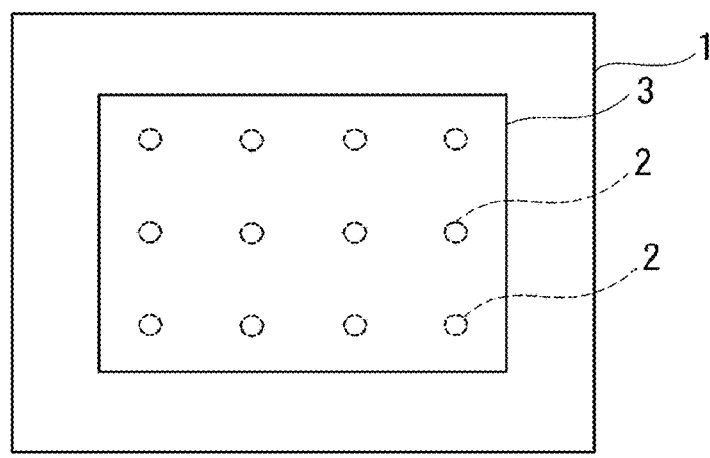
[FIG. 5]
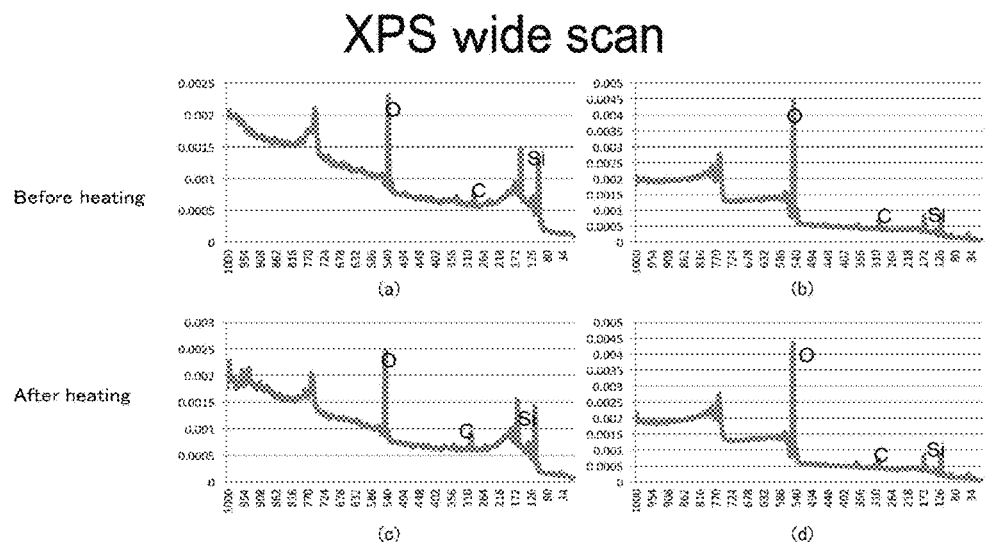

[FIG. 6]
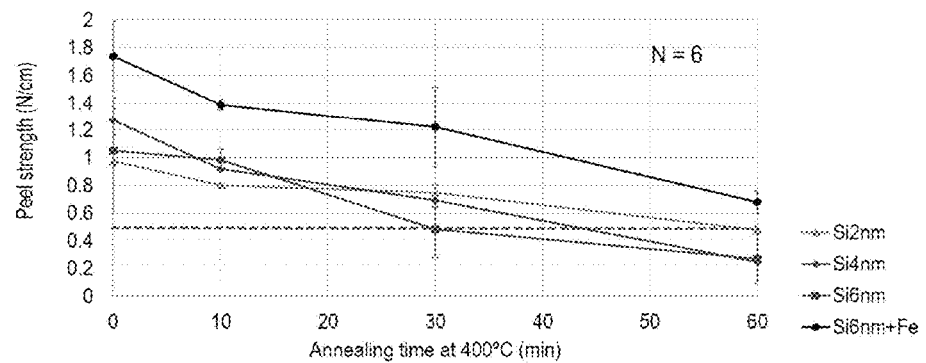
[FIG. 7]
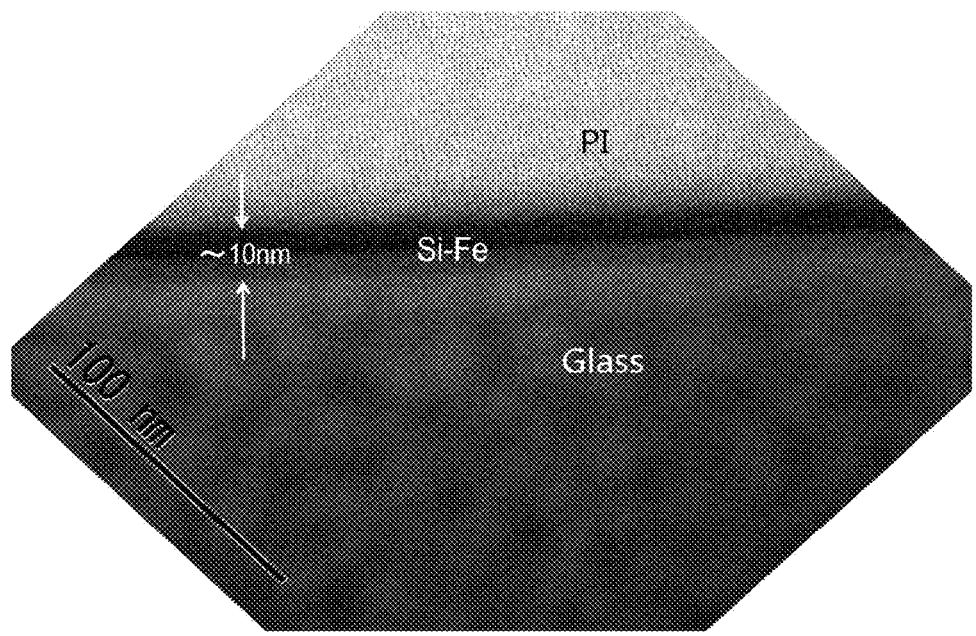

[FIG. 8]
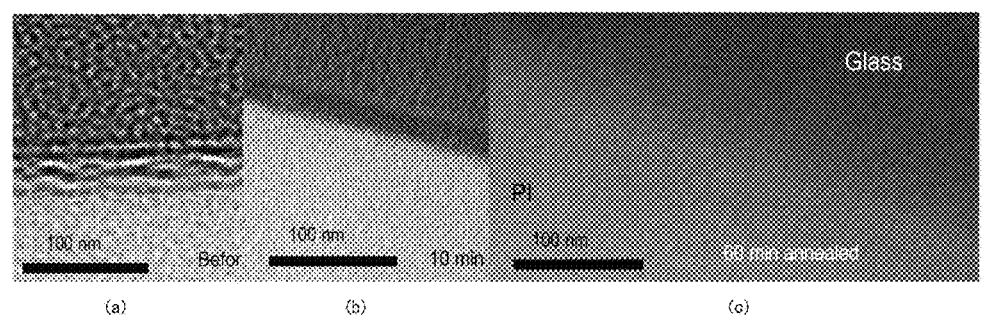

THIN SUBSTRATE, METHOD FOR MANUFACTURING SAME, AND METHOD FOR TRANSPORTING SUBSTRATE

TECHNICAL FIELD

The present invention relates to a thin substrate, a method for manufacturing the same, and a method for transporting substrates.

BACKGROUND ART

Organic electroluminescence devices (organic EL devices) that make use of organic electroluminescence (organic EL) are composed of planar light-emitting layers comprising organic compounds that are formed on a transparent substrate, and they are increasingly being applied for use in thin displays. Compared to liquid crystal displays, organic EL displays that use organic EL devices have a wider viewing angle, consume less power, and have enough flexibility to be able to be softly bent, and therefore have considerable value for commercial use. Additionally, processes that use thin wafers (e.g., 1 μm) are also being developed in the field of 3D integration of ICs and in the field of MEMS.

However, thin substrates generally have a thickness of from 0.5 μm to 0.2 mm, and there are problems in the methods for transporting thin substrates during device fabrication. The substrate sizes may be chip-sized for smaller sizes, but are usually at least 4 inches square, and in large cases, they may be 1 m square or more. It is difficult to transport such thin substrates using robots or the like.

Therefore, one method that has been conceived is a method of transporting thin substrates by bonding them to the surfaces of transport substrates, in the form of glass substrates, films or wafers that are from about 0.1 mm thick to about 1.1 mm thick. This method has the advantage of allowing existing equipment to be used without modification. However, in the case of transport substrates, a device must be peeled from the transport substrate after completion.

There are three types of thin substrates. One type is thin glass, another is heat-resistant films as represented by polyimides. The third type is wafers. In some cases, wafers are protected by a tape to which a pressure-sensitive adhesive has been applied. In that case, the substrate is a laminate of a wafer and a film.

The currently proposed transport methods are methods using glass or wafers as carriers for transport. In the case of thin glass, because of the properties of glass with respect to glass, the bonding method involves direct bonding while keeping the carrier glass surface in a clean state.

In the case of a heat-resistant film, a film in which a destruction effect occurs when subjected to laser irradiation is formed between the transport glass and the film, and after bonding, the film can be separated by laser irradiation. Additionally, when the thin substrate is a wafer, non-contact transport methods and methods using special chucks have been proposed, but there are limits to the thickness that can be transported. The range of thicknesses that can be transported is around 100 μm, and there are no transport methods for thicknesses of 1 μm or so.

In this case, a method of using a transport substrate could be contemplated. However, there are no good separation methods. Additionally, in the case of a wafer, polishing may be used for thinning. In that case, an adhesive tape is adhered to the wafer in order to prevent cracking or chipping after polishing. In this case also, the use of glass as a carrier has been proposed.

SUMMARY OF THE INVENTION

Thin substrates, for example, in displays, may undergo a heating step at approximately 300° C. to 500° C. during a TFT formation process. Additionally, in semiconductor processing of wafers or the like, an annealing step may reach temperatures of 800° C. or more. Since they must undergo such heating steps, there is no favorable method for peeling a thin substrate from a transport substrate.

When the thin substrate is glass and the transport substrate is also glass, there is a problem in that the adhesive force between the glass is strong and ultrathin glass may be chipped during separation. When the transport substrate is glass and the thin substrate is a film, methods of introducing a specific film between the transport glass and the film, and after completion of the panel, separating by laser irradiation from the glass side have been tried.

However, since the laser irradiation is performed by scanning, the process takes time. Additionally, there is a problem in that the film can be damaged by laser irradiation. Furthermore, while glass or a wafer might be considered for transportation of a thin wafer, there is no method of separation in that case, so these are not realistic options.

Additionally, there is a so-called back-grinding process wherein a pressure-sensitive adhesive tape that can be separated by irradiation with UV rays is adhered to a wafer, and the wafer is thereafter thinned by polishing, but even in that case, carrier glass is needed as a support substrate.

In this case also, a method of separation is sought wherein the pressure-sensitive adhesive tape and the glass do not become separated by the pressure of polishing, but can be easily separated after polishing.

The present invention was made in consideration of the above-mentioned problems in the conventional art, and provides a method for transportation during the process of manufacturing a thin substrate, wherein a substrate (glass, film or wafer) can be bonded to a transport substrate and easily separated.

The present invention provides a method for manufacturing a substrate having an electronic device formed on a surface, the method comprising a formation step for forming an inorganic material layer on at least one of a bonding surface by which the substrate having an electronic device formed on a surface is to be bonded to a transport substrate, and a bonding surface on the transport substrate for transporting the substrate; a bonding step for pressing the substrate and the transport substrate against each other and bonding the substrate and the transport substrate by the inorganic material layer; and a separation step for separating the substrate and the transport substrate.

According to one embodiment of the present invention, the above-mentioned manufacturing method further comprises, before or after the bonding step and before the separation step, an electronic device formation step for forming an electronic device on the substrate, and a sealing step for sealing the electronic device with another substrate.

According to one embodiment of the present invention, the above-mentioned manufacturing method further comprises, before the bonding step, a surface activation step for activating the bonding surface of at least one of the substrate and the transport substrate, by irradiation with particles having a prescribed kinetic energy.

According to one embodiment of the present invention, the above-mentioned manufacturing method further comprises, before the bonding step, a surface activation step for activating the surface of the inorganic material layer by irradiation with particles having a prescribed kinetic energy.

According to one embodiment of the present invention, in the above-mentioned manufacturing method, a portion of the substrate is selectively surface-activated before the bonding step.

According to one embodiment of the present invention, in the above-mentioned manufacturing method, a portion of the inorganic material layer is selectively surface-activated before the bonding step.

According to one embodiment of the present invention, in the above-mentioned manufacturing method, a plurality of inorganic material layers of different types are formed.

According to one embodiment of the present invention, in the above-mentioned manufacturing method, the substrate is glass.

According to one embodiment of the present invention, in the above-mentioned manufacturing method, the substrate is a film comprising an organic material.

According to one embodiment of the present invention, in the above-mentioned manufacturing method, the substrate is a wafer comprising silicon or a compound semiconductor.

According to one embodiment of the present invention, in the above-mentioned manufacturing method, the substrate is composed of a plurality of layers, includes a layer comprising glass, and includes a layer comprising an organic material.

According to one embodiment of the present invention, in the above-mentioned manufacturing method, the substrate is composed of a layer comprising glass and a layer comprising an organic material, and the side having the layer comprising an organic material is bonded to the transport substrate.

According to one embodiment of the present invention, in the above-mentioned manufacturing method, the substrate is composed of a plurality of layers, includes a layer comprising silicon or a compound semiconductor, and includes a layer comprising an organic material.

According to one embodiment of the present invention, in the above-mentioned manufacturing method, the substrate is composed of a layer comprising silicon or a compound semiconductor and a layer comprising an organic material, and the side having the layer comprising an organic material is bonded to the transport substrate.

According to one embodiment of the present invention, in the above-mentioned manufacturing method, a film including a resin material layer and a substrate layer is provided on the bonding surface of the substrate, before the formation step for forming the inorganic material layer.

According to one embodiment of the present invention, in the above-mentioned manufacturing method, the thickness of the substrate is at least 0.5 µm and at most 0.5 mm.

According to one embodiment of the present invention, in the above-mentioned manufacturing method, the thickness of the transport substrate is at least 0.1 mm and at most 1.1 mm.

According to one embodiment of the present invention, in the above-mentioned manufacturing method, the inorganic material layer is formed so as to surround the electronic device formed on the substrate, in plan view from the substrate surface side.

According to one embodiment of the present invention, in the above-mentioned manufacturing method, the inorganic material layer is formed in a discrete manner.

Additionally, the present invention provides a method for manufacturing a substrate having an electronic device formed on a surface, the method comprising a formation step for forming an inorganic material layer on at least one of a bonding surface by which the substrate having an electronic device formed on a surface is to be bonded to a film, and a bonding surface on the film for transporting the substrate; and a bonding step for pressing the substrate and the film against each other and bonding the substrate and the film by the inorganic material layer; wherein a device substrate including the substrate and the film is manufactured.

According to one embodiment of the present invention, in the above-mentioned manufacturing method, the bonding step is performed by a roll-to-roll method.

According to one embodiment of the present invention, the above-mentioned manufacturing method further comprises, before or after the bonding step and before the separation step, an electronic device formation step for forming an electronic device on the substrate, and a sealing step for sealing the electronic device with another substrate.

According to one embodiment of the present invention, in the above-mentioned manufacturing method, the bonding surface of at least one of the substrate and the transport substrate is exposed to a gas atmosphere including an inert gas, before the substrate bonding step.

According to one embodiment of the present invention, in the above-mentioned manufacturing method, the inert gas is nitrogen, argon or a mixed gas thereof.

According to one embodiment of the present invention, in the above-mentioned manufacturing method, the substrate bonding step is performed in a vacuum atmosphere or in a gas atmosphere containing an inert gas.

According to one embodiment of the present invention, in the above-mentioned manufacturing method, the inert gas is nitrogen, argon or a mixed gas thereof.

According to one embodiment of the present invention, in the above-mentioned manufacturing method, the substrate bonding step is performed in a reduced-pressure atmosphere or a vacuum for which the background pressure is at least $1 \times 10^{-8}$ Pa and less than atmospheric pressure.

According to one embodiment of the present invention, a thin substrate manufactured by the above-mentioned manufacturing method is provided.

According to one embodiment of the present invention, an electronic device formation substrate having an electronic device formed on the surface of the above-mentioned thin substrate is provided.

Additionally, the present invention provides a method for transporting a substrate comprising a formation step for forming an inorganic material layer on at least one of a bonding surface by which the substrate having an electronic device formed on a surface is to be bonded to a transport substrate, and a bonding surface on the transport substrate for transporting the substrate; a bonding step for pressing the substrate and the transport substrate against each other and bonding the substrate and the transport substrate by the inorganic material layer; and a separation step for separating the substrate and the transport substrate.

Additionally, the present invention provides a method for transporting a substrate comprising a formation step for forming an inorganic material layer on at least one of a bonding surface by which the substrate having an electronic device formed on a surface is to be bonded to a film, and a bonding surface on the film for transporting the substrate; and a bonding step for pressing the substrate and the film against each other and bonding the substrate and the film by the inorganic material layer; wherein a device substrate including the substrate and the film is manufactured.

The present invention provides a method that allows a substrate to be bonded to a transport substrate and to be easily separated during the manufacture of the substrate.

BRIEF DESCRIPTION OF THE DRAWINGS

FIG. 1 A schematic view explaining the steps in a manufacturing method according to an embodiment of the present invention.

FIG. 2 A schematic side view of a substrate-bonded body according to an embodiment of the present invention.

FIG. 3 A schematic top view of a substrate-bonded body according to an embodiment of the present invention.

FIG. 4 A schematic top view of a substrate-bonded body according to an embodiment of the present invention.

FIG. 5 A diagram showing the analysis results of a separated surface of a bonded body according to an example of the present invention.

FIG. 6 A graph showing the peel strength of a bonded body according to an example of the present invention.

FIG. 7 A photograph of the bonding surface of a bonded body according to an example of the present invention.

FIG. 8 A photograph of the bonding surface of a bonded body according to any example of the present invention.

MODES FOR CARRYING OUT THE INVENTION

Herebelow, the present invention will be explained by describing embodiments thereof, but it should be self-evident that the present invention is not limited to these specific embodiments.

Embodiment 1

The manufacturing method of the present embodiment is a method for manufacturing a substrate having an electronic device formed on a surface, the method comprising a formation step for forming an inorganic material layer 2 on at least one of a bonding surface by which the substrate 3 having an electronic device 4 formed on a surface is to be bonded to a transport substrate, and a bonding surface on the transport substrate 1 for transporting the substrate; a bonding step for pressing the substrate 3 and the transport substrate 1 against each other and bonding the substrate 3 and the transport substrate 1 by the inorganic material layer 2; and a separation step for separating the substrate 3 and the transport substrate 1.

In the present embodiment, a surface refers to the front or rear surface of a plate-shaped member.

In a manufacturing method having the above-mentioned configuration, even if a heat treatment at, for example, 300° C. to 500° C. is performed during a step after substrate bonding, the substrate and the transport substrate can thereafter be easily separated. Alternatively, there is a possibility that the substrate and the transport substrate could be easily separated even when a heat treatment is performed at an even higher temperature, depending on the materials and the conditions.

The above-mentioned manufacturing method may further comprise, before or after the bonding step and before the separation step, an electronic device formation step for forming an electronic device 4 on the substrate, and a sealing step for sealing the electronic device with another substrate.

Examples of the electronic device 4 formed on the substrate 3 include, but are not limited to, TFTs and organic EL devices. If the electronic device 4 is, for example, a TFT (thin-film transistor), then there is a heating step at about 300° C. to 500° C. during the formation process thereof.

FIG. 1 is a diagram for explaining an example of a manufacturing method according to the present embodiment. For this example, an embodiment is shown wherein an inorganic material layer 2 is formed on the transport substrate 1.

(a) Transport Substrate Preparation Step

A transport substrate 1 is provided for placement of a substrate 3 on the surface of which an electronic device 4 is to be formed.

(b) Formation Step

An inorganic material layer 2 is formed on the surface of the transport substrate 1 (the bonding surface with the substrate 3) for transporting the substrate 3.

(c) Bonding Step

The substrate 3 and the transport substrate 1 are pressed against each other, and the substrate 3 and the transport substrate 1 are bonded by the inorganic material layer 2 to form a substrate-bonded body.

(d) Electronic Device Formation Step

An electronic device 4 is formed on the substrate 3 of the substrate-bonded body. Thereafter, a sealing step for bonding another substrate (cover-side substrate 5) so as to seal the electronic device 4 of the substrate-bonded body is performed, thereby forming the device.

(e) Separation Step

The substrate 3 on which the electronic device 4 is formed is separated from the transport substrate 1. Due to this process, a device including a substrate 3 having an electronic device 4 formed on the surface is obtained. In this example, the inorganic material layer 2 is left on the transport substrate 1 side.

The above-mentioned manufacturing method may further comprise the below-mentioned surface activation step between steps (b) and (c).

The above-mentioned manufacturing method may further comprise, before the bonding step, a surface activation step for activating the bonding surface of at least one of the substrate 3 or the transport substrate 1, by irradiation with particles having a prescribed kinetic energy.

Alternatively, the above-mentioned manufacturing method may further comprise, before the bonding step, a surface activation step for activating the surface of the inorganic material layer 2 by irradiation with particles having a prescribed kinetic energy.

The surface activation process during the surface activation step allows the bonding strength of the bonding interface between the transport substrate 1, the inorganic material layer 2 or the substrate 3 to be increased.

By inducing a phenomenon (sputtering phenomenon) wherein the matter forming the bonding surface is physically knocked away by collision of particles having a prescribed kinetic energy, surface layers such as oxides or contaminants can be removed, and a newly produced surface of inorganic material having a high surface energy, i.e. that is active, can be exposed.

As the particles to be used in the surface activation process, it is possible, for example, to use a noble gas or inert gas such as neon (Ne), argon (Ar), krypton (Kr), xenon (Xe) or helium (He). These noble gases do not tend to undergo chemical reactions with the matter forming the bonding surfaces with which they collide, so they will not greatly change the chemical properties of the bonding surfaces, such as by forming compounds.

The particles to be collided with the bonding surfaces that are to be surface-activated may be imparted with the prescribed kinetic energy by accelerating the particles in the direction of the bonding surfaces by using a particle beam source or a plasma generation device.

The kinetic energy of the particles collided with the surface-activated bonding surface is preferably from 1 eV to 2 keV. The above-mentioned kinetic energy can be considered to result in an efficient sputtering effect in the surface layer. A desired kinetic energy value can also be set from within the above-mentioned range of kinetic energies in accordance with the thickness of the surface layer to be removed, the properties of the material, and the material of the newly produced surface.

The prescribed kinetic energy can also be imparted to the particles using a particle beam source. The particle beam source operates in a relatively high vacuum, with a background pressure, for example, of $1 \times 10^{-8}$ Pa (Pascals) or less. In order to draw a relatively high vacuum, matter removed from the surface of the metal regions is efficiently vented outside the atmosphere by operating a vacuum pump.

As a result, the deposition of undesirable matter on the exposed newly produced surface can be suppressed. Furthermore, since a relatively high acceleration voltage can be applied to a particle beam source, a high kinetic energy can be imparted to the particles. Therefore, the surface layer can be efficiently removed and the newly produced surface can be activated.

Alternatively, the surface activation process may be performed in a reduced-pressure atmosphere or a vacuum for which the background pressure is at least $1 \times 10^{-8}$ Pa and less than atmospheric pressure.

As the particle beam source, it is possible to use an ion beam source that ejects an ion beam or a neutral atom beam source that ejects a neutral atom beam. As the ion beam source, a cold cathode-type ion source may be used.

As the neutral atomic beam source, it is possible to use a fast atom beam (FAB) source. A fast atom beam source (FAB) typically has a configuration that involves generating a gaseous plasma, applying an electric field to this plasma, extracting the cations among the ionized particles from the plasma and passing them through an electron cloud to neutralize them.

In this case, for example, when argon (Ar) is used as the noble gas, the power supplied to the fast atom beam source (FAB) may be set to 1.5 kV (kilovolts) and 15 mA (milliamperes), or to a value from 0.1 to 500 W (wafts). For example, if a fast atom beam source (FAB) is operated at 100 W (wafts) to 200 W (watts) and a bonding surface is irradiated for 2 minutes with a fast atom beam of argon (Ar), then the above-mentioned oxides and contaminants (surface layer) can be removed from the bonding surface and a newly produced surface can be exposed.

In the present invention, the particles that are used for surface activation may be neutral atoms or ions, and furthermore, may be radical species, or groups of particles that are mixtures thereof.

The surface layer removal rate may change depending on the plasma or beam source operating conditions, or the kinetic energy of the particles. Therefore, the processing time necessary for the surface activation process must be adjusted.

For example, the time until the presence of oxygen or carbon contained in the surface layer can no longer be observed using surface analysis methods such as Auger electron spectroscopy (AES) or X-ray photo-electron spectroscopy (XPS), or a longer time, may be used as the processing time for the surface activation process.

The prescribed kinetic energy may also be imparted to the particles using a plasma generation device. By applying an alternating voltage to the substrate bonding surface, a plasma containing particles can be generated around the bonding surface, and the cations among the ionized particles in the plasma can be accelerated towards the bonding surface by the above-mention voltage to thereby impart the prescribed kinetic energy.

Since a plasma can be generated in a low-vacuum atmosphere of a few pascals (Pa), the vacuum system can be simplified and processes such as evacuation can be shortened.

In the above-mentioned manufacturing method, a portion of the substrate may be selectively surface-activated before the bonding step for bonding the substrate 3 and the transport substrate 1.

Additionally, a portion of the inorganic material layer may be selectively surface-activated before the bonding step.

The portion of the inorganic material layer may, for example, be the outer peripheral portion of the substrate 3. By performing surface activation on only the outer peripheral portion, the bonding strength becomes higher at the outer peripheral portion than in the central portion of the substrate 3, which is favorable.

In the above-mentioned manufacturing method, a plurality of different types of inorganic material layers may be formed. For example, different types of inorganic material layers may be formed at the central portion and the outer peripheral portion of the substrate 3.

As a result, a difference in bonding strength can be provided between the central portion and the outer peripheral portion of the substrate 3, and for example, the bonding strength can be controlled in accordance with the substrate.

Alternatively, a plurality of different types of inorganic material layers may be laminated to form an inorganic material layer. As a result, inorganic material layers that have appropriate bonding strengths for the substrate and the transport substrate respectively can be selectively formed.

Additionally, a portion of the plurality of inorganic material layers may be selectively surface-activated.

The transport substrate 1 may be formed from a plate-type or film-type glass, a heat-resistant film, a wafer or a composite material thereof.

More specifically, the transport substrate 1 should preferably be a heat-resistant film, a glass substrate, or a substrate having a heat-resistant film applied to glass if the substrate 3 is a thin glass, should preferably be glass if the substrate 3 is a heat-resistant film, and should preferably be a wafer or glass if the substrate 3 is a wafer. Additionally, the substrate 3 may be composed of a wafer and a film.

The transport substrate 1 may be provided in the form of a sheet or rolled into a roll.

The transport substrate 1 preferably has a thickness of at least 0.1 mm and at most 1.1 mm in order to allow existing equipment to be used.

The inorganic material layer 2 is formed by using an inorganic material selected from the group consisting of metals, semiconductors, nitrides, oxynitrides, oxides and carbides as the main components. As a result, separation between the substrate and the transport substrate can be suppressed, even in a cleaning step during TFT processing, which is post-treatment.

As the inorganic material layer 2, it is possible to use a metal including aluminum (Al) or a transition metal such as nickel (Ni), copper (Cu), iron (Fe), titanium (Ti), tantalum (Ta), chromium (Cr), gold (Au) or platinum (Pt), a solder alloy including tin (Sn) or silver (Ag) or an alloy thereof, a semiconductor such as silicon (Si), or a nitride, an oxynitride, an oxide or a carbide such as silicon oxide ($SiO_2$), silicon nitride ($SiN_x$), silicon oxynitride ($SiN_xO_y$), aluminum oxide ($Al_2O_3$), aluminum nitride (AlN), titanium nitride (TiN), silicon carbide (SiC) or titanium carbide (TiC).

A plurality of the inorganic material layers 2 may be formed. In other words, the structure may be formed by laminating a first inorganic material layer and a second inorganic material layer. In this case, materials such as Si and SiN in which the bonding strength does not increase between the films even when heated are chosen for the first inorganic material layer and the second inorganic material layer. Other films might be contemplated when considering just the requirement that the bonding strength should not increase.

The inorganic material layer 2 is preferably formed by a deposition method such as plasma-enhanced chemical vapor deposition (PECVD) or sputter deposition, but is not limited thereto. When forming the inorganic material layer 2, it may be formed at only prescribed areas by using a prescribed mask.

Additionally, when forming the inorganic material layer 2 by depositing a prescribed inorganic material such as by plasma-enhanced chemical vapor deposition (PECVD) or sputtering of the prescribed inorganic material, an inorganic material other than the prescribed inorganic material may be mixed in.

For example, when carrying out sputter deposition by irradiating a sputtering target with a particle beam and causing the prescribed inorganic material of the sputtering target to be released from the sputtering target, a target comprising an inorganic material other than the prescribed inorganic material should be disposed in the path of the particle beam.

As a result, a mixed inorganic material wherein an inorganic material other than the prescribed inorganic material is mixed with the prescribed inorganic material may be used for sputter deposition. For example, it is preferable to use silicon (Si) as the prescribed inorganic material, and to use a transition metal such as iron (Fe) as the inorganic material other than the prescribed inorganic material. As a result, the bonding strength of the inorganic material layer 2 is raised, and a bonding interface with high strength and high sealing performance can be formed.

The inorganic material layer 2 used for bonding between the substrate 3 and the transport substrate 1 is preferably adjusted to a film thickness and film quality that allows for easy peeling after undergoing a heating step or a cleaning step.

The substrate 3 is preferably glass. Alternatively, the substrate 3 is preferably a film comprising an organic material such as PI (polyimide), PEN (polyethylene naphthalate), PET (polyethylene terephthalate) or COP (cycloolefin polymer).

Additionally, the substrate 3 is preferably a wafer comprising silicon or a compound semiconductor (e.g., GaP, GaAs, InP or GaN).

The thickness of the substrate 3 is preferably at least 0.5 μm and at most 0.5 mm, more preferably at least 0.5 μm and at most 0.2 mm. The substrate 3 may be supplied in the form of a sheet or rolled into a roll.

In the above-mentioned manufacturing method, the substrate may be composed of a plurality of layers, and may include a layer comprising glass and a layer comprising an organic material. In that case, the substrate may be composed of a layer comprising glass and a layer comprising an organic material, and the side having the layer comprising an organic material may be bonded to the transport substrate.

For example, as shown in FIG. 2, a laminated substrate 8 comprising a glass layer 6 and an organic material layer 7 may be used. In this case, a combination of glass and PI is particularly preferable for the materials constituting the glass layer 6 and the organic material layer 7. Additionally, when bonding the glass layer 6 and the organic material layer 7, it is preferable to use a method wherein the inorganic material layer is formed on either the glass layer 6 or the organic material layer 7, and a prescribed energy is imparted to surface-activate the inorganic material surface. This is because, when an adhesive is used, problems such as solidification can occur during the heating step.

In the above-mentioned manufacturing method, the substrate may be constituted from a plurality of films. In the above-mentioned manufacturing method, a film including a resin material layer and a substrate layer may be provided on the bonding surface of the substrate, before the formation step for forming the inorganic material layer.

For example, the material composing the substrate layer, while not particularly limited, may be PET (polyethylene terephthalate), PEN (polyethylene naphthalate) or PI (polyimide), and a material containing these substances forms a substrate of a film supporting the resin material layer. The substrate layer is preferably stretchable, and preferably transmits light of specific wavelengths.

Additionally, the film preferably contains a resin material layer, which bonds the film to the substrate, and functions as an adhesive layer or a pressure-sensitive adhesive layer. While the material composing the resin material layer is not particularly limited, it should preferably be broken down or set by irradiation with UV rays or electron rays, or by heating, and examples include acrylic resins and epoxy resins.

For example, a film may be applied to a pressure-sensitive adhesive layer on a silicon wafer (substrate 3), and the film may be bonded to the transport substrate.

In the above-mentioned manufacturing method, the inorganic material layer 2 may be formed so as to surround the electronic device 4 formed on the substrate 3, in plan view from the substrate 3 surface side, as shown, for example, in FIG. 3.

As a result, in the separation step, the transport substrate 1 and the substrate 3 can be easily separated by cutting away the outer peripheral portions of the inorganic material layer 2.

In the above-mentioned manufacturing method, as shown, for example, in FIG. 4, the inorganic material layer 2 may be formed discretely. Aside therefrom, a shape such as a lattice could be used as the form of the inorganic material layer 2. By using such a structure, the force applied to the substrate 3 during separation can be suppressed, and damage can be prevented.

Conventionally, a transport substrate that has once been used is then discarded, but according to the manufacturing method of the above-mentioned embodiment, the transport substrate can be reused because the substrate is not damaged by laser irradiation or the like, and an organic adhesive is not used.

Embodiment 2

According to another embodiment, the present invention provides a method for manufacturing a substrate having an electronic device formed on a surface, the method comprising a formation step for forming an inorganic material layer on at least one of a bonding surface by which the substrate having an electronic device formed on a surface is to be bonded to a film, and a bonding surface on the film for transporting the substrate; and a bonding step for pressing the substrate and the film against each other and bonding the substrate and the film by the inorganic material layer; wherein a device substrate including the substrate and the film is manufactured.

Additionally, the above-mentioned manufacturing method may further comprise, before or after the bonding step and before the separation step, an electronic device formation step for forming an electronic device on the substrate. Additionally, the method may further comprise, after the formation of the electronic device, a sealing step for applying a cover glass or a cover film.

In the above-mentioned manufacturing method, the bonding step may be performed using a roll-to-roll method. As a result, the advantage of obtaining a significant increase in the mass production of the thin substrate can be achieved.

For example, when the aforementioned surface activation step is used, the bonding strength between the substrates can become strong, and depending on the conditions or materials used in the respective steps, it becomes difficult to easily separate the substrate from the transport substrate during the separation step.

The manufacturing method of Embodiment 2 uses thin glass as the substrate, and has the advantage of allowing the transport film to be used not only as the carrier, but also as a protective film for the substrate. When this manufacturing method is used, there is no need to separate the substrate.

In the manufacturing methods according to the embodiments explained above, the substrate bonding step may be performed in a vacuum atmosphere or in a gas atmosphere including an inert gas. As a result, the bonding strength between the transport substrate 1 and the substrate 3 can be easily controlled. The gas atmosphere including the inert gas, for example, may be hydrogen diluted with argon, or nitrogen gas with a controlled partial pressure of water vapor.

The inert gas may contain nitrogen, argon or a mixed gas thereof as the main component. The inert gas may be nitrogen, argon or a mixed gas thereof.

In the manufacturing methods according to the embodiments explained above, the bonding surface between the substrate and the transport substrate may be exposed to an inert gas atmosphere before the substrate bonding step. As a result, changes in the bonding strength between the transport substrate 1 and the substrate 3 due to heating are not likely to occur. The gas atmosphere including the inert gas, for example, may be hydrogen diluted with argon, or nitrogen gas with a controlled partial pressure of water vapor.

The inert gas may contain nitrogen, argon or a mixed gas thereof as the main component. The inert gas may be nitrogen, argon or a mixed gas thereof.

In the manufacturing method according to the above-mentioned embodiment, the substrate bonding step may be performed in a reduced-pressure atmosphere or a vacuum for which the background pressure is at least $1 \times 10^{-8}$ Pa and less than atmospheric pressure.

By controlling the basic vacuum level, the water and oxygen contained in the inorganic film can be appropriately controlled. An inorganic film having an appropriately controlled water content and oxygen content will not have an increased bonding strength when the inorganic film is heated, and can be easily separated.

Additionally, the substrates may be bonded together without using the aforementioned surface activation step. For example, in an inorganic material layer that is formed by deposition in a vacuum, oxidation or contamination by impurities will not progress on the surface, and the surface energy will be high.

By contacting the surfaces of such inorganic material layers together, a bonding interface of relatively high strength can be formed.

Additionally, when the surface of the substrate 3 is strongly bonded to the inorganic material formed on the transport substrate 1, there is no need to form a second inorganic material layer on the substrate 3.

In the above-described embodiment, a cover-side substrate 5 may also be subjected to the processing of the substrate 3 explained in the above-described embodiment.

The cover-side substrate 5, in some cases, may have few steps in which heat is applied, and if the cover-side substrate 5 is a color filter, it is heated to about 200° C.

Other Embodiments

In the above-described embodiments, when a heat-resistant film is used as the substrate, an inorganic film for preventing the permeation of moisture must be provided on the device-side surface, because heat-resistant films as represented by polyimides are easily permeated by moisture.

For this reason, the surface must be flat. In order to ensure the flatness of the film surface that is to form the substrate, a liquid resin may be applied to glass and dried to form a film.

As the method for application of the resin or the like, slit coating is preferably used. Additionally, the inorganic material may be composed of a plurality of films. This is in order to form a plurality of films that can be separated between the layers of an inorganic film formed on the transport substrate-side and an inorganic film on the resin portions, even when the inorganic film contacting the liquid resin portions, after the liquid resin portions are set, remain on the side of the set resin at the time of separation.

The formation of the inorganic material layer and the resin coating should preferably be performed in a vacuum or in a nitrogen gas environment. This is because the amount of moisture on the bonding interface is likely to significantly affect the bond after heating. Moisture makes the bond stronger after heating, and this has a detrimental impact on the separation.

In the case of this embodiment as well, the features of the above-described Embodiments 1 and 2 can be used, aside from the feature of forming the substrate using a liquid resin or the like.

The present invention provides a thin substrate that is manufactured by a manufacturing method according to the above-described embodiments. Additionally, an electronic device formation substrate having an electronic device formed on the surface of a thin substrate can be provided by the manufacturing method according to the above-described embodiment.

Additionally, the present invention provides a method for transporting a substrate comprising a formation step for forming an inorganic material layer on at least one of a bonding surface by which the substrate having an electronic device formed on a surface is to be bonded to a transport substrate, and a bonding surface on the transport substrate for transporting the substrate; a bonding step for pressing the substrate and the transport substrate against each other and bonding the substrate and the transport substrate by an inorganic material layer; and a separation step for separating the substrate and the transport substrate.

Additionally, the present invention provides a method for transporting a substrate comprising a formation step for forming an inorganic material layer on at least one of a bonding surface by which the substrate having an electronic device formed on a surface is to be bonded to a film, and a bonding surface on the film for transporting the substrate; and a bonding step for pressing the substrate and the film against each other and bonding the substrate and the film by the inorganic material layer; wherein a device substrate including the substrate and the film is manufactured.

While embodiments of the present invention have been described above, it should be self-evident that the present invention includes combinations of the respective features of these embodiments.

Examples

Herebelow, examples will be described.

The tests for Examples 1 to 4 were performed using the following procedure.

(1) Preparation of Glass Substrate (Transport Substrate)

An alkali-free glass having a thickness of 0.5 mm was prepared as a hypothetical transport substrate.

(2) Preparation of Polyimide Film

Two types of polyimide films having different thicknesses and surface roughnesses were prepared.

In order to remove the moisture in the films themselves, they were heated for 1 hour at 100° C.

(3) Formation of Inorganic Material Layer

Ion beam sputtering was used to form Si (silicon) and Cu (copper) inorganic material layers on the surfaces of both the glass substrate and the polyimide films. At this time, the input power values for the ion beam were 1.2 kV/400 mA.

Additionally, two types of bonding films with different film thicknesses were prepared, and their respective impacts on the bonding strength were studied. The conditions for the inorganic material layers are shown in Table 1.

(4) Ambient-Temperature Bonding Treatment

Ambient-temperature bonding treatments were performed under the below-indicated conditions. The conditions are shown in Table 1.

(Ambient-Temperature Bonding Conditions)

Ion Beam Irradiation Conditions:

| | |
|---|---|
| Si | 1.2 kV/400 mA, Ar = 80 sccm, 3 scans |
| Cu | 1.2 kV/400 mA, Ar = 80 sccm, 1 scan |

Press Conditions:
5 kN/5 min.

(5) Separation Test

Separation tests were performed manually.

Separation was possible both when unheated and when heated (300° C., 400° C. and 500° C.). However, there were cases in which the inorganic material layer remained on the surface of the polyimide film or remained on the surface of the glass, due to differences in the surface roughness of the polyimide films.

TABLE 1

| | | | Example 1 | Example 2 | Example 3 | Example 4 |
|---|---|---|---|---|---|---|
| Film thickness | (μm) | | 38 | | 50 | |
| Surface roughness | Ra (nm) | | 1.099 | | 5.559 | |
| | Rmax (nm) | | 21.39 | | 62.19 | |
| Glass | | | alkali-free glass ⌀ 50 t = 0.5 mm | | | |
| Ambient temperature bonding treatment | Baking | | 100° C./1 h | | | |
| | Pretreatment | | none | | | |
| | Target | | Si | Cu | Si | Cu |
| | Intermediate film treatment | | 1.2 kV/400 mA | | | |
| | No. of scans | | 3 | 1 | 3 | 1 |
| | Scanning speed | | 20 mm/s | | | |
| | Post-treatment | | none | | | |
| | Press conditions | | 5 kN/5 min | | | |
| | Film thickness | | 6 nm | 2 nm | 6 nm | 2 nm |
| Bonding strength | No heating | | Separation possible. Intermediate film remained on glass. | Separation possible. Intermediate film remained on glass. | Separation possible. Separated at intermediate film. | Separation possible. Intermediate film remained on glass. |
| | 300° C. | 10 min | Separation possible. Intermediate film remained on glass. | Separation possible. Intermediate film remained on glass. | — | — |
| | | 30 min | Separation possible. Intermediate film remained on glass. | — | — | — |
| | 400° C. | 10 min | Separation possible. Intermediate film remained on glass. | Separation possible. Intermediate film remained on glass. | Separation possible. Separated at intermediate film. | Separation possible. Intermediate film separated unevenly. |
| | | 30 min | Separation possible. Intermediate film remained on glass. | — | — | — |
| | 500° C. | 10 min | Separation possible. Intermediate film remained on glass. | Separation possible. Intermediate film remained on glass. | — | — |
| | | 30 min | Separation possible. Intermediate film remained on glass. | — | — | — |

Next, Examples 5 to 40 will be described. Examples 5 to 40 were performed by the below-indicated procedures.

(1) Preparation of Glass Substrate (Base Substrate)

An alkali-free glass having a thickness of 0.5 mm was prepared as a hypothetical transport substrate. The size (diameter) and set location of each substrate was as indicated in Tables 2 to 6. The expression "in GB" refers to bonding inside a glove box. The conditions in the glove box at this time were such as to contain an $N_2$ atmosphere at atmospheric pressure.

(2) Preparation of Glass Substrate (Cover Substrate)

An alkali-free glass having a thickness of 0.5 mm was prepared. The size (diameter) and setting location of each substrate was as indicated in Tables 2 to 6. The expression "in GB" refers to bonding inside a glove box. The conditions in the glove box at this time were such as to contain an $N_2$ atmosphere at atmospheric pressure.

(3) Pretreatment

For a number of examples, one or both surfaces of the glass substrate were subjected to a pretreatment. The pretreatments were performed under conditions of 1.3 kV/400 mA and Ar=70 sccm, and the number of scans were as indicated in Tables 2 to 6.

(4) Formation of Inorganic Material Layer (Intermediate Film)

Ion beam sputtering was used to form a Si (silicon) or SiN (silicon nitride) inorganic material layer on one or both surfaces of the glass substrate.

At this time, the input values for the ion beam were 1.2 kV/400 mA for Si (silicon) and 1.5 kV/400 mA for SiN (silicon nitride). The scanning speed was 20 mm/s.

(5) Post-Treatment

For some of the examples, one or both surfaces of the glass substrate were subjected to a post-treatment. The conditions of the post-treatment were 1.3 kV/400 mA and Ar=70 sccm, and the number of scans were as indicated in Tables 2 to 6.

TABLE 2

| Sample No. | Base Substrate | Cover Substrate | Base Substrate Setting Location | Cover Substrate Setting Location | Base Substrate Pretreatment No. of Scans | Cover Substrate Pretreatment No. of Scans | Base Substrate Intermediate Film | Cover Substrate Intermediate Film | Base Substrate Intermediate Film No. of Scans | Cover Substrate Intermediate Film No. of Scans | Base Substrate Post-treatment No. of Scans | Cover Substrate Post-treatment No. of Scans |
|---|---|---|---|---|---|---|---|---|---|---|---|---|
| 5  | ⌀ 100 | ⌀ 100 | air | air | 0 | 0 | si   | si   | 3 | 3 | 0 | 0 |
| 6  | ⌀ 100 | ⌀ 100 | air | air | 0 | 0 | si   | none | 3 | 3 | 0 | 0 |
| 7  | ⌀ 100 | ⌀ 100 | air | air | 0 | 0 | si   | none | 3 | 0 | 1 | 1 |
| 8  | ⌀ 100 | ⌀ 100 | air | air | 0 | 0 | si   | si   | 5 | 5 | 0 | 0 |
| 9  | ⌀ 100 | ⌀ 100 | air | air | 0 | 0 | si   | none | 3 | 0 | 0 | 0 |
| 10 | ⌀ 100 | ⌀ 100 | air | air | 0 | 0 | none | none | 0 | 0 | 1 | 1 |
| 11 | ⌀ 100 | ⌀ 100 | air | air | 0 | 0 | none | none | 0 | 0 | 5 | 5 |
| 12 | ⌀ 100 | ⌀ 100 | air | air | 0 | 0 | none | none | 0 | 0 | 1 | 1 |
| 13 | ⌀ 100 | ⌀ 100 | air | air | 0 | 0 | none | none | 0 | 0 | 5 | 5 |
| 14 | ⌀ 100 | ⌀ 100 | air | air | 0 | 0 | none | none | 0 | 0 | 0 | 0 |
| 15 | ⌀ 100 | ⌀ 100 | air | air | 0 | 0 | none | none | 0 | 0 | 0 | 0 |
| 16 | ⌀ 100 | ⌀ 100 | air | air | 0 | 0 | si   | none | 3 | 0 | 0 | 0 |
| 17 | ⌀ 100 | ⌀ 100 | air | air | 0 | 0 | sin  | none | 3 | 0 | 0 | 0 |
| 18 | ⌀ 100 | ⌀ 100 | air | air | 0 | 0 | si   | none | 3 | 0 | 0 | 0 |
| 19 | ⌀ 100 | ⌀ 100 | air | air | 0 | 0 | si   | none | 3 | 0 | 0 | 0 |
| 20 | ⌀ 100 | ⌀ 100 | air | air | 0 | 0 | si   | none | 3 | 0 | 0 | 0 |
| 21 | ⌀ 100 | ⌀ 50  | air | air | 0 | 0 | si   | none | 3 | 0 | 0 | 0 |
| 22 | ⌀ 100 | ⌀ 50  | air | air | 0 | 0 | si   | none | 3 | 0 | 0 | 0 |
| 23 | ⌀ 100 | ⌀ 50  | air | air | 0 | 0 | si   | none | 3 | 0 | 0 | 0 |
| 24 | ⌀ 100 | ⌀ 50  | air | air | 0 | 0 | si   | none | 3 | 0 | 0 | 0 |
| 25 | ⌀ 100 | ⌀ 50  | air | air | 0 | 0 | si   | none | 3 | 0 | 0 | 0 |
| 26 | ⌀ 100 | ⌀ 50  | air | air | 0 | 0 | si   | none | 3 | 0 | 0 | 0 |

TABLE 3

| Sample No. | Base Substrate | Cover Substrate | Base Substrate Setting Location | Cover Substrate Setting Location | Base Substate Pretreatment No. of Scans | Cover Substrate Pretreatment No. of Scans | Base Substrate Intermediate Film | Cover Substrate Intermediate Film | Base Substrate Intermediate Film No. of Scans | Cover Substrate Intermediate Film No. of Scans | Base Substrate Post-treatment No. of Scans | Cover Substrate Post-treatment No. of Scans |
|---|---|---|---|---|---|---|---|---|---|---|---|---|
| 27 | ⌀ 100 | ⌀ 50 | in GB | in GB | 0 | 0 | si | none | 3 | 0 | 0 | 0 |
| 28 | ⌀ 100 | ⌀ 50 | air   | air   | 0 | 0 | si | si   | 3 | 3 | 0 | 0 |
| 29 | ⌀ 100 | ⌀ 50 | air   | air   | 0 | 0 | si | si   | 3 | 3 | 1 | 1 |

TABLE 4

| Sample No. | Base Substrate | Cover Substrate | Base Substrate Setting Location | Cover Substrate Setting Location | Base Substrate Pre-treatment No. of Scans | Cover Substrate Pre-treatment No. of Scans | Base Substrate Intermediate Film | Cover Substrate Intermediate Film | Base Substrate Intermediate Film No. of Scans | Cover Substrate Intermediate Film No. of Scans | Base Substrate Post-treatment No. of Scans | Cover Substrate Post-treatment No. of Scans |
|---|---|---|---|---|---|---|---|---|---|---|---|---|
| 30 | ⌀ 100 | ⌀ 100 | air | air | 2 | 2 | si | si | 5 | 5 | 2 | 2 |
| 31 | ⌀ 100 | ⌀ 100 | air | air | 0 | 0 | si | si | 5 | 5 | 2 | 2 |
| 32 | ⌀ 100 | ⌀ 100 | air | air | 2 | 0 | si | none | 5 | 0 | 2 | 0 |
| 33 | ⌀ 100 | ⌀ 100 | air | air | 0 | 0 | si | none | 5 | 0 | 2 | 0 |
| 34 | ⌀ 100 | ⌀ 100 | air | air | 0 | 0 | si | none | 5 | 0 | 0 | 0 |
| 35 | ⌀ 100 | ⌀ 100 | air | air | 0 | 0 | none | none | 0 | 0 | 2 | 2 |

TABLE 5

| Sample No. | Base Substrate | Cover Substrate | Base Substrate Setting Location | Cover Substrate Setting Location | Base Substrate Pre-treatment No. of Scans | Cover Substrate Pre-treatment No. of Scans | Base Substrate Intermediate Film | Cover Substrate Intermediate Film | Base Substrate Intermediate Film No. of Scans | Cover Substrate Intermediate Film No. of Scans | Base Substrate Post-treatment No. of Scans | Cover Substrate Post-treatment No. of Scans |
|---|---|---|---|---|---|---|---|---|---|---|---|---|
| 36 | ⌀ 100 | ⌀ 100 | air | air | 0 | 0 | si | none | 5 | 0 | 2 | 0 |
| 37 | ⌀ 100 | ⌀ 100 | air | air | 0 | 0 | si | none | 5 | 0 | 0 | 0 |

TABLE 6

| Sample No. | Base Substrate | Cover Substrate | Base Substrate Setting Location | Cover Substrate Setting Location | Base Substrate Pre-treatment No. of Scans | Cover Substrate Pre-treatment No. of Scans | Base Substrate Intermediate Film | Cover Substrate Intermediate Film | Base Substrate Intermediate Film No. of Scans | Cover Substrate Intermediate Film No. of Scans | Base Substrate Post-treatment No. of Scans | Cover Substrate Post-treatment No. of Scans |
|---|---|---|---|---|---|---|---|---|---|---|---|---|
| 38 | ⌀ 100 | ⌀ 100 | in GB | in GB | 2 | 0 | si | none | 5 | 0 | 2 | 0 |
| 39 | ⌀ 100 | ⌀ 100 | in GB | in GB | 0 | 0 | si | none | 5 | 0 | 2 | 0 |
| 40 | ⌀ 100 | ⌀ 100 | in GB | in GB | 0 | 0 | si | none | 5 | 0 | 0 | 0 |

(6) Ambient-Temperature Bonding Treatment

Ambient-temperature bonding treatments and separation tests were performed under the conditions shown in Tables 7 to 11.

(7) Separation Test

Under the conditions shown in Tables 7 to 11, unheated and heated (350° C., 450° C., 500° C. and 550° C.) separation tests were performed on the bonded substrates.

TABLE 7

| Sample No. | Bonding Location | Bonding Environment | Bonding Wait Time | Press Condition | Bonding Strength Before Heating (J/m$^2$) | Bonding Strength After Heating for 90 min at 350° C. | Bonding Strength After Heating for 90 min at 450° C. | Bonding Strength After Heating for 90 min at 500° C. | Bonding Strength After Heating for 90 min at 550° C. |
|---|---|---|---|---|---|---|---|---|---|
| 5 | chamber | vacuum | 60 min | 5 kN/5 min | 0.09 | | | | |
| 6 | chamber | vacuum | 60 min | 5 kN/5 min | 1.61 | | | | |
| 7 | chamber | vacuum | 60 min | 5 kN/5 min | 0.37 | | | | |
| 8 | chamber | vacuum | 60 min | 5 kN/5 min | 0.14 | | 0.67 | | |
| 9 | chamber | vacuum | 60 min | 5 kN/5 min | 0.88 | | 0.53 | | |
| 10 | chamber | vacuum | 5 min | 5 kN/5 min | 0.21 | | 0.94 | | |
| 11 | chamber | vacuum | 5 min | 5 kN/5 min | 0.21 | | 1.05 | | |
| 12 | chamber | vacuum | 5 min | 5 kN/5 min | 0.16 | | 0.96 | | |
| 13 | chamber | vacuum | 5 min | 5 kN/5 min | 0.23 | | 0.89 | | |
| 14 | chamber | vacuum | 5 min | 5 kN/5 min | 0.045 | | 0.072 | | |
| 15 | chamber | vacuum | 5 min | 5 kN/5 min | 0.039 | | 0.076 | | |
| 16 | chamber | vacuum | 60 min | 5 kN/5 min | 0.868 | | 0.328 | | |
| 17 | chamber | vacuum | 60 min | 5 kN/5 min | 0.453 | | 0.446 | | |
| 18 | chamber | vacuum | 60 min | 5 kN/5 min | 0.194 | | | | |
| 19 | chamber | vacuum | 60 min | 5 kN/5 min | | | 0.160 | | |
| 20 | chamber | vacuum | 60 min | 5 kN/5 min | | | | | |
| 21 | chamber | vacuum | 60 min | 5 kN/5 min | 0.96 | | 0.34 | | |

TABLE 7-continued

| Sample No. | Bonding Location | Bonding Environment | Bonding Wait Time | Press Condition | Bonding Strength Before Heating (J/m^2) | Bonding Strength After Heating for 90 min at 350° C. | Bonding Strength After Heating for 90 min at 450° C. | Bonding Strength After Heating for 90 min at 500° C. | Bonding Strength After Heating for 90 min at 550° C. |
| --- | --- | --- | --- | --- | --- | --- | --- | --- | --- |
| 22 | chamber | vacuum | 60 min | 5 kN/5 min | 0.85 | | 0.33 | | |
| 23 | chamber | vacuum | 60 min | 5 kN/5 min | 0.78 | | 0.36 | | |
| 24 | chamber | vacuum | 60 min | 5 kN/5 min | 0.71 | | 0.41 | | |
| 25 | chamber | vacuum | 60 min | 5 kN/5 min | 0.78 | | 0.40 | | |
| 26 | chamber | vacuum | 60 min | 5 kN/5 min | 0.81 | | 0.42 | | |

TABLE 8

| Sample No. | Bonding Location | Bonding Environment | Bonding Wait Time | Press Condition | Bonding Strength Before Heating (J/m^2) | Bonding Strength After Heating for 90 min at 350° C. | Bonding Strength After Heating for 90 min at 450° C. | Bonding Strength After Heating for 90 min at 500° C. | Bonding Strength After Heating for 90 min at 550° C. |
| --- | --- | --- | --- | --- | --- | --- | --- | --- | --- |
| 27 | chamber | bonding after N2 substitution in chamber | 5 min | 5 kN/5 min | 1.02 | | 0.33 | | |
| 28 | chamber | bonding after N2 substitution in chamber | 5 min | 5 kN/5 min | 0.15 | | 0.72 | | |
| 29 | chamber | bonding after N2 substitution in chamber | 5 min | 5 kN/5 min | 0.20 | | 0.60 | | |

TABLE 9

| Sample No. | Bonding Location | Bonding Environment | Bonding Wait Time | Press Condition | Bonding Strength Before Heating (J/m^2) | Bonding Strength After Heating for 90 min at 350° C. | Bonding Strength After Heating for 90 min at 450° C. | Bonding Strength After Heating for 90 min at 500° C. | Bonding Strength After Heating for 90 min at 550° C. |
| --- | --- | --- | --- | --- | --- | --- | --- | --- | --- |
| 30 | GB | nitrogen at atmospheric pressure | 60 min | manual | 0.14 | 0.37 | 0.34 | 0.60 | 0.61 |
| 31 | GB | nitrogen at atmospheric pressure | 5 min | manual | 0.12 | 0.38 | 0.55 | 0.53 | 0.60 |
| 32 | GB | nitrogen at atmospheric pressure | 5 min | manual | 0.60 | | 0.50 | 0.60 | 0.82 |
| 33 | GB | nitrogen at atmospheric pressure | 5 min | manual | 0.24 | 0.44 | 0.49 | 0.30 | 0.47 |
| 34 | GB | nitrogen at atmospheric pressure | 5 min | manual | 0.56 | 0.28 | 0.52 | 0.48 | |
| 35 | GB | nitrogen at atmospheric pressure | 5 min | manual | 0.16 | 0.72 | 0.99 | 0.71 | |

TABLE 10

| Sample No. | Bonding Location | Bonding Environment | Bonding Wait Time | Press Condition | Bonding Strength Before Heating (J/m^2) | Bonding Strength After Heating for 90 min at 350° C. | Bonding Strength After Heating for 90 min at 450° C. | Bonding Strength After Heating for 90 min at 500° C. | Bonding Strength After Heating for 90 min at 550° C. |
| --- | --- | --- | --- | --- | --- | --- | --- | --- | --- |
| 36 | exposed to air | atmospheric pressure | 5 min | manual | 0.44 | 0.44 | 0.42 | | |
| 37 | exposed to air | atmospheric pressure | 5 min | manual | 0.30 | | 0.47 | | |

TABLE 11

| Sample No. | Bonding Location | Bonding Environment | Bonding Wait Time | Press Condition | Bonding Strength Before Heating (J/m²) | Bonding Strength After Heating for 90 min at 350° C. | Bonding Strength After Heating for 90 min at 450° C. | Bonding Strength After Heating for 90 min at 500° C. | Bonding Strength After Heating for 90 min at 550° C. |
|---|---|---|---|---|---|---|---|---|---|
| 38 | chamber | vacuum | 5 min | 5 kN/5 min | 0.92 | 0.14 | 0.36 | 0.45 | |
| 39 | chamber | vacuum | 5 min | 5 kN/5 min | 0.93 | 0.20 | 0.39 | 0.43 | |
| 40 | chamber | vacuum | 5 min | 5 kN/5 min | 1.00 | 0.21 | 0.33 | 0.44 | |

Herebelow, the results of bonding and separation tests between glass substrates are shown. In Test Examples 41 to 44, bonding was performed in a vacuum.

TABLE 12

| | Initial Strength (J/m2) | Strength After Heating (J/m2) | Intermediate Layer 1 | Intermediate Layer 2 | Bonding Environment |
|---|---|---|---|---|---|
| 41 | 0.04 | 0.07 | Fe | Fe | vacuum |
| 42 | 0.2 | 1 | Si | Si | vacuum |
| 43 | 0.4 | 1.2 | Fe—Si—Fe | Fe—Si—Fe | vacuum |
| 44 | 2.5 | 2.5 | Si | Si | vacuum |
| 45 | 0.14 | 0.7 | Si | Si | vacuum |
| 46 | 0.15 | 0.7 | Si—Fe | Si—Fe | nitrogen atmosphere |
| 47 | 0.12 | 0.55 | Fe—Si—Fe | Fe—Si—Fe | nitrogen atmosphere |
| 48 | 0.14 | 0.34 | Si | — | nitrogen atmosphere |
| 49 | 1 | 0.3 | Si—Fe | — | nitrogen atmosphere |
| 50 | 0.6 | 0.5 | Fe—Si—Fe | — | nitrogen atmosphere |
| 51 | 0.8 | 0.35 | Si | — | vacuum |
| 52 | 0.9 | 0.4 | Si—Fe | — | vacuum |
| 53 | 0.9 | 0.4 | Fe—Si—Fe | — | vacuum |
| 54 | 0.5 | 0.5 | SiN | — | vacuum |

(Results of Strength Evaluation)

According to the results of a strength evaluation, the examples that had a high initial strength were Test Example 44, Test Example 49, Test Example 50 and Test Examples 51-53. Additionally, the examples wherein the strength after heating was low (<0.5 J/m²) were Test Example 49, Test Example 50 and Test Examples 51-53.

This can be considered to be due to the fact that the reaction between glass and Si intermediate layers is weak. Additionally, the strength after heating did not depend very much on whether a nitrogen or vacuum bonding atmosphere was used.

Here, "symmetrical" means that an inorganic material layer was provided on both glass substrates. Additionally, "asymmetrical" means that an inorganic material layer was provided on one of the glass substrates, while an inorganic material layer was not provided on the other glass substrate, and an activation treatment was not performed.

Heating can be considered to increase the strength due to diffusion, in symmetrical bonding of Si with Si and Fe with Fe.

The above-indicated results show that the initial strength is low when there is no activation, and when using only symmetrical Fe intermediate layers or only symmetrical Si intermediate layers. On the other hand, the initial strength is high for symmetrical Fe—Si (Test Example 44).

(Initial Strength)

Symmetrical Fe intermediate layers, symmetrical Si intermediate layers and symmetrical Fe—Si intermediate layers all had low initial strength (bonding strength before heating) regardless of whether vacuum bonding or nitrogen bonding was performed. This is thought to be due to nitrogen being adsorbed to the surface of the Si or Fe intermediate layer and inhibiting the bonding between the adsorption surfaces.

Additionally, in the case of SiN (Example 54), the strength was moderate (0.5 J/m²) before and after heating.

In the asymmetrical examples, it can be seen that the initial strength is high regardless of whether vacuum bonding or nitrogen bonding is performed. This is thought to be due to the fact that nitrogen is only involved in the physical adsorption to the glass surface and does not contribute to the chemical bond, and bonds occur between the glass surfaces $SiO_2$ and the surfaces Si—N and Fe—N where nitrogen has been absorbed to Si or Fe.

(Impact of Heating)

As a result of heating, the strength becomes moderate (0.3 to 0.7 J/m²) in all cases. Si and Fe are thought to become uniform by diffusion, the average for the Si—Fe layer being 0.4 J/m² and the average for the Si layer being 0.5 J/m², and there are no differences due to the interface layer.

Additionally, no great difference is observed between vacuum bonding and nitrogen bonding.

While it is common for the strength to increase by heating, when nitrogen is included, there can be expected to be a possibility that the densification of the interface layer will be inhibited, as a result of which the increase in strength becomes moderate.

FIG. 5 shows XPS (X-ray photo-electron spectroscopy) scan data of the separated surface before and after heating (450° C., 90 minutes) for Example 61.

As shown in FIG. 5, no change in the separated surface before and after heating is observed in the XPS scan data.

If the optimal conditions are considered to be those wherein the strength after heating is moderate and allows relatively easy peeling, and compared thereto, the initial strength is relatively high, then such conditions are met by nitrogen bonding or vacuum bonding of an asymmetrical Si intermediate layer (the combination of untreated glass and an Si intermediate layer), and when further considering the ease of processing, then nitrogen bonding can be considered to be optimal.

Next, the results of Test Examples 55 to 57 using an argon gas atmosphere as the bonding environment will be described.

TABLE 13

| Glass | | 55 | 56  alkali-free glass φ 100 t = 0.5 mm | 57 |
|---|---|---|---|---|
| Ambient temperature bonding treatment | Target Treated surface | both surfaces | Si | one surface |
| | Pretreatment | | none | |
| | Intermediate film treatment | | 1.2 kV/400 mA | |
| | No of scans | | 3 | |
| | Scanning speed | | 20 mm/s | |
| | Post-treatment | | none | |
| | Bonding environment | Ar at atmospheric pressure | vacuum | Ar at atmospheric pressure |
| | Press conditions | | 5 kN/5 min | |
| | Film thickness on one surface | | 6 nm | |
| Bonding strength | No heating | Separation possible. Si film remained on both sides. | Separation possible. Si film remained on treated surface. | Separation possible. Si film remained on treated surface. |
| | 200° C.   90 min | Although manually separated, bond strength slightly rose relative to before heating, but separation was still possible. Si film remained on both sides. | Although manually separated, bond strength slightly rose relative to before heating, but separation was still possible. Si film remained on treated surface | Although manually separated, bond strength slightly rose relative to before heating, but separation was still possible. Si film remained on treated surface |

Test Example 55 is an example wherein a silicon film is formed on both substrates and the substrates are bonded together in argon. Test Example 56 is an example wherein a film is only formed on one of the substrates, and the substrates are bonded together entirely in a vacuum, without substituting an inert gas. Test Example 57 is an example wherein a film is formed on one of the substrates and the substrates are bonded together in an argon atmosphere.

In the following examples, bonding strength measurement results are shown for test examples using only a silicon inorganic material layer and test examples further comprising an Fe inorganic material layer on the silicon inorganic material layer, when bonding a polyimide film and a glass substrate by an inorganic material layer.

As the polyimide film, XENOMAX (manufactured by Toyobo, thickness 38 μm, surface roughness (Ra) 1 nm or less) was used. As the glass substrate, an alkali-free glass (thickness 500 μm, diameter 2 inches, surface roughness (Ra) 0.4 nm or less) was used.

The above-mentioned polyimide film and glass substrate were bonded to form a bonded body provided with a 2 nm silicon layer, a bonded body provided with a 4 nm silicon layer, a bonded body provided with a 6 nm silicon layer and a bonded body provided with a 6 nm silicon layer and an Fe layer.

Separation tests were performed for each of the bonded bodies that were bonded. The results of the separation tests are shown in FIG. 6. FIG. 6 shows the relationship between the heating time (annealing time) and the separation strength (peel strength) when each bonded body was heated at 400° C.

These results show that separation is possible when an Fe inorganic material layer is further provided on the surface of the silicon inorganic material layer. Additionally, the results show that by further providing an Fe inorganic material layer on the surface of the silicon inorganic material layer, the bonding strength can be improved over the case where there is only an inorganic material layer comprising silicon.

The dashed line in the graph of FIG. 6 indicates a strength of 0.48 N/m. In the case of the film of the present example, the film plastically deformed when the strength was 0.48 N/m or more.

FIG. 7 is an electron microscope photograph showing the bonded portion of a bonded body formed by bonding a polyimide film and a glass substrate by an inorganic material layer formed by providing an Fe inorganic material layer on the surface of a silicon inorganic material layer. The interface between the silicon and the Fe is dense, and the formation of such an interface is thought to make the bonding strength higher.

FIG. 8 is an electron microscope photograph showing the bonded portion of a bonded body formed by bonding a polyimide film and a glass substrate by an inorganic material layer formed by providing an Fe inorganic material layer on the surface of a silicon inorganic material layer, showing the change over time.

FIG. 8 shows results for (a) before heating, (b) heating for 10 minutes at 400° C., and (c) heating for 60 minutes at 400° C. By heating, the interface is first densified, and thereafter, the silicon is gradually diffused in the polyimide (PI) according to the heating time, until finally, the interface layer can no longer be observed.

This shows that, as the silicon diffuses due to heating, damage moves from the polyimide glass interface to the interior of the polyimide. In the case of (b) heating for 10 minutes at 400° C., separation is possible, and in the case of (c) heating for 60 minutes at 400° C., there is a possibility that the polyimide will be broken.

According to the above-described results, the manufacturing method comprising a formation step, a bonding step and a separation step according to the present invention can be understood to allow the substrate to be bonded to the transport substrate and to be easily separated.

DESCRIPTION OF THE REFERENCE NUMBERS 1 transport substrate
2 inorganic material layer
3 substrate
4 electronic device
5 cover-side substrate
6 glass layer
7 organic material layer
8 laminated substrate

The invention claimed is:

1. A method for manufacturing a substrate having an electronic device formed on a surface, the method comprising:
    (i) forming an inorganic material layer on at least one of a bonding surface by which the substrate having an electronic device formed on a surface is to be bonded to a transport substrate, and a bonding surface on the transport substrate for transporting the substrate;
    (ii) pressing the substrate and the transport substrate against each other and bonding the substrate and the transport substrate by the inorganic material layer; and
    (iii) separating the substrate having an electronic device formed on a surface and the transport substrate,
    wherein the bonding surface of at least one of the substrate and the transport substrate is exposed to a gas atmosphere comprising an inert gas, before the substrate bonding (ii).

2. The manufacturing method according to claim 1, further comprising, before or after the bonding (ii) and before the separation (iii), forming an electronic device on the substrate, and sealing the electronic device with another substrate.

3. The manufacturing method according to claim 1, further comprising, before the bonding (ii), activating the bonding surface of at least one of the substrate and the transport substrate, by irradiation with particles having a prescribed kinetic energy.

4. The manufacturing method according to claim 1, further comprising, before the bonding (ii), activating the surface of the inorganic material layer by irradiation with particles having a prescribed kinetic energy.

5. The manufacturing method according to claim 1, wherein a portion of the substrate is selectively surface-activated before the bonding (ii).

6. The manufacturing method according to claim 1, wherein a portion of the inorganic material layer is selectively surface-activated before the bonding (ii).

7. The manufacturing method according to claim 1, wherein a plurality of inorganic material layers of different types are formed.

8. The manufacturing method according to claim 1, wherein the substrate is glass.

9. The manufacturing method according to claim 1, wherein the substrate is a film comprising an organic material.

10. The manufacturing method according to claim 1, wherein the substrate is a wafer comprising silicon or a compound semiconductor.

11. The manufacturing method according to claim 1, wherein the substrate is composed of a plurality of layers, comprising a layer comprising glass, and a layer comprising an organic material.

12. The manufacturing method according to claim 11, wherein the substrate is composed of a layer comprising glass and a layer comprising an organic material, and a side having the layer comprising an organic material is bonded to the transport substrate.

13. The manufacturing method according to claim 1, wherein the substrate is composed of a plurality of layers, comprising a layer comprising silicon or a compound semiconductor, and a layer comprising an organic material.

14. The manufacturing method according to claim 13, wherein the substrate is composed of a layer comprising silicon or a compound semiconductor and a layer comprising an organic material, and a side having the layer comprising an organic material is bonded to the transport substrate.

15. The manufacturing method according to claim 1, wherein a film comprising a resin material layer and a substrate layer is applied on the bonding surface of the substrate, before the forming (i) of the inorganic material layer.

16. The manufacturing method according to claim 1, wherein the thickness of the substrate is at least 0.5 µm and at most 0.5 mm.

17. The manufacturing method according to claim 1, wherein the thickness of the transport substrate is at least 0.1 mm and at most 1.1 mm.

18. The manufacturing method according to claim 1, wherein the inorganic material layer is formed so as to surround the electronic device formed on the substrate, in plan view from the substrate surface side.

19. The manufacturing method according to claim 1, wherein the inorganic material layer is formed in a discrete manner.

20. The manufacturing method according to claim 1, wherein the inert gas is nitrogen, argon or a mixed gas thereof.

21. The manufacturing method according to claim 1, wherein the substrate bonding (ii) is performed in a vacuum atmosphere or in a gas atmosphere comprising an inert gas.

22. The manufacturing method according to claim 21, wherein the inert gas is nitrogen, argon or a mixed gas thereof.

23. The manufacturing method according to claim 1, wherein the substrate bonding (ii) is performed in a reduced-pressure atmosphere or a vacuum for which a background pressure is at least $1 \times 10^{-8}$ Pa and less than atmospheric pressure.

24. A thin substrate manufactured by the manufacturing method according claim 1.

25. An electronic device formation substrate having an electronic device formed on the surface of a thin substrate according to claim 24.

26. A method for manufacturing a substrate having an electronic device formed on a surface, the method comprising:
    (i) forming an inorganic material layer on at least one of a bonding surface by which the substrate having an electronic device formed on a surface is to be bonded to a film, and a bonding surface on the film for transporting the substrate; and
    (ii) pressing the substrate and the film against each other and bonding the substrate and the film by the inorganic material layer;
    wherein the bonding surface of at least one of the substrate and the film is exposed to a gas atmosphere comprising an inert gas, before the substrate bonding (ii), and
    wherein a device substrate comprising the substrate and the film is manufactured.

27. The manufacturing method according to claim 26, wherein the bonding (ii) is performed by a roll-to-roll method.

28. The manufacturing method according to claim 26, further comprising, before or after the bonding (ii), forming an electronic device on the substrate, and sealing the electronic device with another substrate.

29. The manufacturing method according to claim 26, wherein the inert gas is nitrogen, argon or a mixed gas thereof.

30. The manufacturing method according to claim 26, wherein the substrate bonding (ii) is performed in a vacuum atmosphere or in a gas atmosphere comprising an inert gas.

31. The manufacturing method according to claim 30, wherein the inert gas is nitrogen, argon or a mixed gas thereof.

32. The manufacturing method according to claim 26, wherein the substrate bonding (ii) is performed in a reduced-pressure atmosphere or a vacuum for which a background pressure is at least $1\times10^{-8}$ Pa and less than atmospheric pressure.

33. A method for transporting a substrate, comprising:
(i) forming an inorganic material layer on at least one of a bonding surface by which the substrate having an electronic device formed on a surface is to be bonded to a transport substrate, and a bonding surface on the transport substrate for transporting the substrate;
(ii) pressing the substrate and the transport substrate against each other and bonding the substrate and the transport substrate by the inorganic material layer; and
(iii) separating the substrate having an electronic device formed on a surface and the transport substrate,
wherein the bonding surface of at least one of the substrate and the transport substrate is exposed to a gas atmosphere comprising an inert gas, before the substrate bonding (ii).

34. A method for transporting a substrate, comprising:
(i) forming an inorganic material layer on at least one of a bonding surface by which the substrate having an electronic device formed on a surface is to be bonded to a film, and a bonding surface on the film for transporting the substrate; and
(ii) pressing the substrate and the film against each other and bonding the substrate and the film by the inorganic material layer;
wherein the bonding surface of at least one of the substrate and the film is exposed to a gas atmosphere comprising an inert gas, before the substrate bonding (ii),
wherein a device substrate comprising the substrate and the film is manufactured.

35. A thin substrate manufactured by the manufacturing method according to claim 26.

36. An electronic device formation substrate having an electronic device formed on the surface of a thin substrate according to claim 35.

* * * * *